(12) United States Patent
Luechinger et al.

(10) Patent No.: US 8,926,760 B2
(45) Date of Patent: Jan. 6, 2015

(54) SYSTEMS AND METHODS FOR PROCESSING SOLAR SUBSTRATES

(75) Inventors: Christoph Benno Luechinger, Irvine, CA (US); Erich Christoph Mueller, Huntington Beach, CA (US); Orlando Luis Valentin, Rancho Santa Margarita, CA (US); Tao Xu, Irvine, CA (US)

(73) Assignee: Orthodyne Electronics Corporation, Irvine, CA (US)

( * ) Notice: Subject to any disclaimer, the term of this patent is extended or adjusted under 35 U.S.C. 154(b) by 659 days.

(21) Appl. No.: 13/148,834

(22) PCT Filed: Feb. 19, 2010

(86) PCT No.: PCT/US2010/024643
§ 371 (c)(1),
(2), (4) Date: Aug. 10, 2011

(87) PCT Pub. No.: WO2010/096600
PCT Pub. Date: Aug. 26, 2010

(65) Prior Publication Data
US 2011/0308545 A1    Dec. 22, 2011

Related U.S. Application Data

(60) Provisional application No. 61/154,284, filed on Feb. 20, 2009, provisional application No. 61/158,979, filed on Mar. 10, 2009.

(51) Int. Cl.
| B08B 7/00 | (2006.01) |
| H01L 31/05 | (2014.01) |
| H01L 31/02 | (2006.01) |
| H01L 31/032 | (2006.01) |

(52) U.S. Cl.
CPC .......... *H01L 31/05* (2013.01); *H01L 31/02008* (2013.01); *H01L 31/0322* (2013.01); *Y02E 10/50* (2013.01)
USPC ................................................ 134/6; 134/15

(58) Field of Classification Search
None
See application file for complete search history.

(56) References Cited

U.S. PATENT DOCUMENTS

| 1,339,894 | A | * | 5/1920 | Johnson .......................... 15/181 |
| 2007/0111519 | A1 | * | 5/2007 | Lubomirsky et al. .......... 438/678 |
| 2007/0163646 | A1 | * | 7/2007 | Kushiya et al. ............... 136/264 |
| 2009/0283131 | A1 | | 11/2009 | Kushiya et al. |

FOREIGN PATENT DOCUMENTS

| JP | 2001-015777 | 1/2001 |
| JP | 2003-318431 | 11/2003 |
| JP | 2005-191167 | 7/2005 |

OTHER PUBLICATIONS

International Search Report for International Patent Application No. PCT/2010/024643, dated Oct. 5, 2010.

* cited by examiner

*Primary Examiner* — Eric Golightly
(74) *Attorney, Agent, or Firm* — Stradley Ronon Stevens & Young, LLP

(57) ABSTRACT

A method of removing at least a portion of an interaction layer on an electrode region of a solar substrate is provided. The method includes a step of providing a solar substrate including an absorbing region and an electrode region. The absorbing region including an absorbing layer configured to convert light energy into electrical energy. The electrode region is substantially free of the absorbing layer, and the electrode region includes an interaction layer. The method also includes a step of brushing the electrode region to remove at least a portion of the interaction layer.

16 Claims, 12 Drawing Sheets

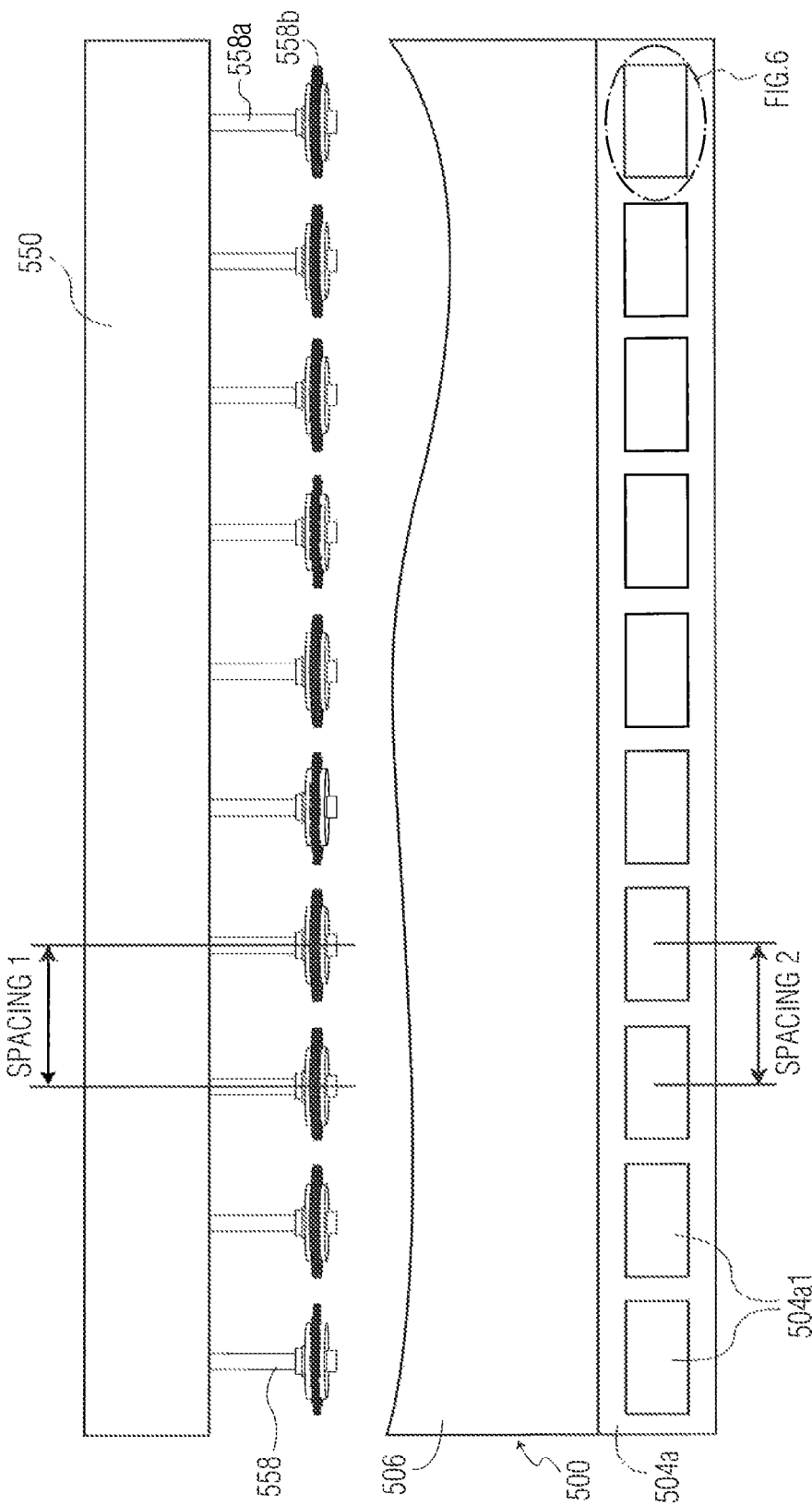

SYSTEMS AND METHODS FOR PROCESSING SOLAR SUBSTRATES

CROSS-REFERENCE TO RELATED APPLICATIONS

This application claims the benefit of International Patent Application No. PCT/US2010/024643 filed on Feb. 19, 2010, which claims the benefit of U.S. Provisional Application Nos. 61/154,284 filed on Feb. 20, 2009; and 61/158,979 filed on Mar. 10, 2009, the contents of each of which is incorporated herein by reference.

FIELD OF THE INVENTION

The present invention relates to systems and methods for processing solar substrates, and more particularly, to improved systems and methods for removing material from solar substrates.

BACKGROUND OF THE INVENTION

Solar panels (such as thin film solar substrates) generate an electrical current in the active area of the panel where the active area includes an absorbing layer that absorbs light energy and converts it into electrical energy. An exemplary absorbing layer includes thin layers of material comprising Cu(In,[Ga])Se (=CI[G]S) which are known to exhibit a high photovoltaic conversion efficiency. As used herein, the term "CIGS" refers to a family of cells using similar absorbing materials, but in somewhat different compositions, etc. The CIGS family includes at least the CIS (Copper-Indium-Sulfide or Copper-Indium-Selenide), CIGS (Copper-Indium-Gallium-Selenide) and CIGSSe (Copper-Indium-Gallium-Sulfur-Selenide) type solar substrates.

The current generated in the active area is transferred to an external electrical circuit. For this purpose, conductors, sometimes referred to as busbars (i.e., one for the positive electrode and one for the negative electrode), may be connected along edges of such a solar panel to collect the generated current. Often the conductors are glued using a conductive epoxy or the like, or soldered by thermal or ultrasonic soldering; however, process limitations and cost have resulted in other interconnection technologies being considered instead of gluing or soldering. FIGS. 1A-1B illustrate the use of conductive ribbons providing the interconnection. Referring to FIG. 1A, solar substrate 100 (i.e., a CIGS type thin film solar substrate) includes glass base material 102 (or another base material such as steel, metal foils, polyimide, other lighter or flexible base materials, among others) and absorbing layer 106. Absorbing layer 106 includes the active material that absorbs and converts light energy into electrical energy. Conductive layer 104 is provided between glass base material 102 and absorbing layer 106. Conductive ribbons 108a and 108b are ultrasonically bonded to electrode regions 104a, 104b at respective bonded portions 108a1 and 108b1. It is important that the bonded portions be of sufficiently low contact resistance to not adversely affect the panel's efficiency, and be very reliable over the life time of the panels. FIG. 1B is a cross-sectional view of solar substrate 100 illustrating a current flow "i" from conductive ribbon 108a to conductive ribbon 108b. As shown in FIG. 1B, absorbing layer 106 includes an upper transparent conductive oxide (TCO) layer 106a (e.g., where the TCO layer may be ZnO or the like for a CIGS type solar substrate).

In an exemplary CIGS solar substrate the absorbing layer initially covers the electrode regions of the conductive layer. Thus, the absorbing layer is removed from the electrode region prior to the ultrasonic bonding of a conductive ribbon or the like. The bulk removal of the absorbing layer in the electrode region may be accomplished using various processes such as scraping and brushing. Unfortunately, contamination of the electrode region still present after removal of the absorbing layer results in challenges to ultrasonic bonding. Such contamination can be caused by an interaction layer between the absorbing layer and the electrode layer.

Thus, it would be desirable to provide improved systems and methods of processing solar substrates for ultrasonic bonding and the like.

SUMMARY OF THE INVENTION

According to an exemplary embodiment of the present invention, a method of removing at least a portion of an interaction layer on an electrode region of a solar substrate is provided. The method includes a step of providing a solar substrate including an absorbing region and an electrode region. The absorbing region includes an absorbing layer configured to convert light energy into electrical energy. The electrode region is substantially free of the absorbing layer, and the electrode region includes an interaction layer. The method also includes a step of brushing the electrode region to remove at least a portion of the interaction layer.

According to another exemplary embodiment of the present invention, a method of cleaning an electrode region of a solar substrate is provided. The method includes: (1) providing a solar substrate including an absorbing region and an electrode region; (2) removing an absorbing layer from at least a portion of the electrode region; and (3) brushing at least a portion of an interaction layer from the portion of the electrode region.

According to yet another exemplary embodiment of the present invention, a system for processing a solar substrate is provided. The system includes a support structure for supporting a solar substrate, and a brushing system for selectively removing an interaction layer from an electrode region of the solar substrate.

According to yet another exemplary embodiment of the present invention, a system for processing a solar substrate is provided. The system includes a removal system for removing an absorbing layer from an electrode region of a solar substrate. The absorbing layer is configured to convert light energy into electrical energy. The system also includes a brushing system for removing an interaction layer from at least a portion of the electrode region.

According to yet another exemplary embodiment of the present invention, a system for processing a solar substrate is provided. The system includes a support structure for supporting a solar substrate. The system also includes a brushing system for selectively removing an interaction layer from an electrode region of the solar substrate. The brushing system includes a plurality of motorized brushes for performing the selective removal of the interaction layer.

According to yet another exemplary embodiment of the present invention, a system for processing a solar substrate is provided. The system includes a removal system for removing an absorbing layer from an electrode region of a solar substrate. The absorbing layer is configured to convert light energy into electrical energy. The system also includes a brushing system for removing an interaction layer from at least a portion of the electrode region. The system also includes an ultrasonic bonding system configured to bond a conductor to the electrode region.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 5A is a block diagram top view of another system for selectively removing an interaction layer from an electrode region of a solar substrate in accordance with an exemplary embodiment of the present invention;

DETAILED DESCRIPTION OF THE INVENTION

Figure 1A:
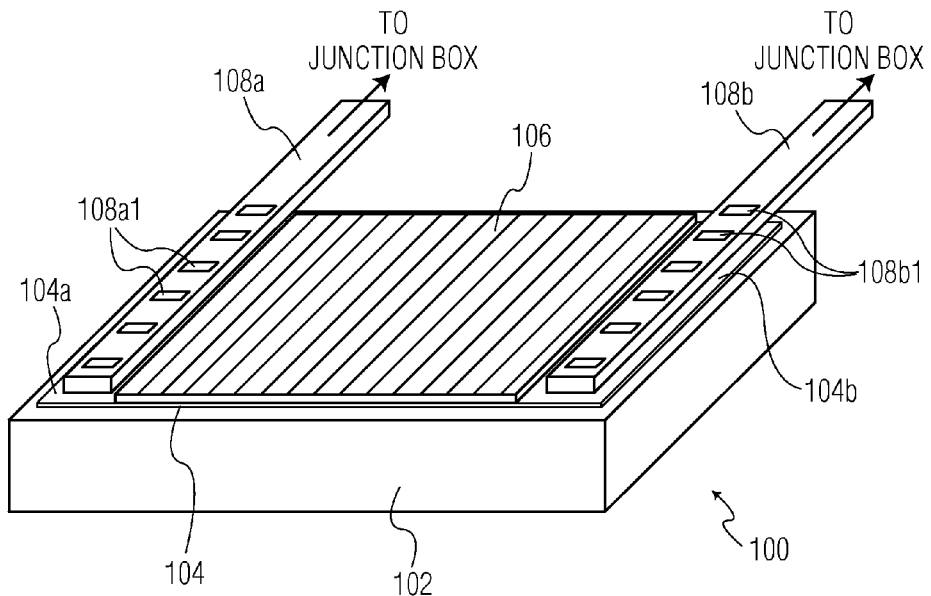
FIG. 1A is a block diagram perspective view of a solar substrate.
Figure 1B:
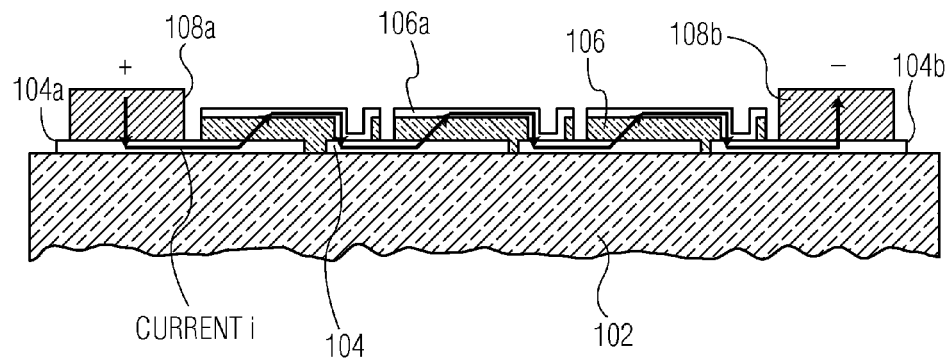
FIG. 1B is a block diagram cross-sectional view of the solar substrate of FIG. 1A.

As provided above, contamination of the electrode region of a solar substrate may render ultrasonic bonding difficult and impractical. In certain CIGS type solar substrates, the conductive layer (e.g., like conductive layer 104 in FIG. 1) may be formed from molybdenum (i.e., Mo). During removal of the absorbing layer from the electrode region (e.g., using scraping, brushing, etc.) of the conductive layer, some of the absorbing material may be worked into the top surface of the electrode layer (e.g., the Mo material).

Further, during formation of the solar substrate, an interaction layer may form between the absorbing layer and the conductive layer. More specifically, in certain CIGS substrates (where the absorbing material includes selenide, and the conductive layer is Mo), an interaction layer of $MoSe_2$ may form between the Mo conductive layer and the CIGS absorbing layer. Another example interaction layer is MoS (e.g., in an example CIS substrate where the absorbing layer includes sulfur).

While some CIGS type solar substrates do not have a substantial interaction layer that affects ultrasonic bonding, others do have such a layer that impedes efficient ultrasonic bonding. For example, ultrasonic bonding with aluminum ribbon material tends to become difficult if there is a substantial selenide presence (e.g., where a selenide is a chemical compound in which selenium serves as an anion with oxidation number of −2) in the interaction layer (e.g., when the interaction layer includes $MoSe_2$). As selenide/selenium is a non-metal, an $MoSe_2$ interaction layer may be considered to be a contaminant on an otherwise bondable conductive layer (e.g., a Mo layer).

The interaction layer may vary in thickness depending upon the manufacturing of a given solar substrate. Typically, the thicker the interaction layer, the more difficult it is to perform ultrasonic bonding. Examples of processes used to form CIGS type solar substrates include (1) elemental co-evaporation, and (2) deposition of elemental layers followed by rapid thermal annealing at high temperatures (or selenization at even higher temperatures). For example, in certain CIGS type solar substrates with porous absorbing layers, Se vapor may directly contact and react with the Mo conductive layer, resulting in the formation of a relatively thick $MoSe_2$ interaction layer. While it may be possible to adjust ultrasonic bonding parameters (e.g., bond force, bond time, etc.) to compensate for the presence of certain interaction layers, it is of course more desirable to bond directly to the clean conductive layer (e.g., an Mo layer).

Figure 2A:
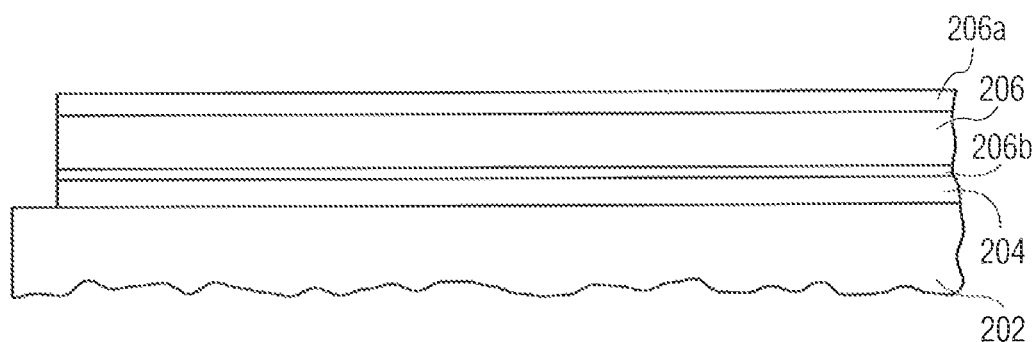
FIGS. 2A-2C are block diagram side views of a portion of a solar substrate illustrating a method of processing a solar substrate in accordance with an exemplary embodiment of the present invention.
Figure 2B:
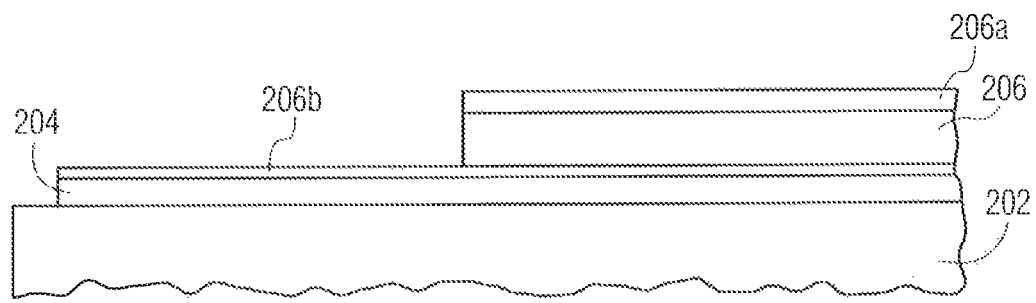
Figure 2C:
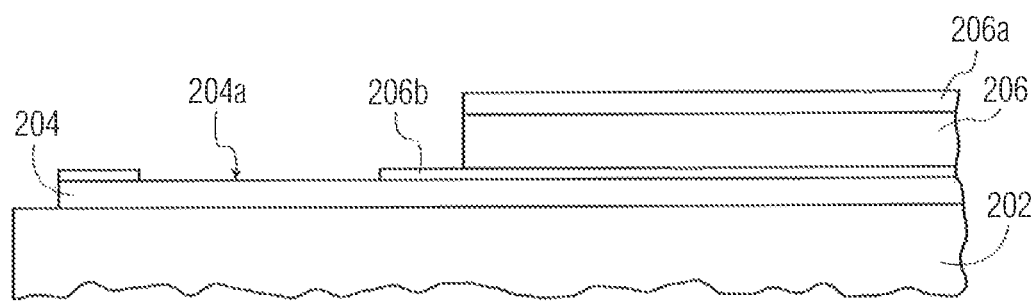

In accordance with various exemplary embodiments of the present invention, systems and methods for selective removal of the interaction layer (e.g., at the location where conductive bonds are to be formed) after the removal of the absorbing layer are provided. In such examples, a two step cleaning process may be utilized. First, the absorbing layer is removed from the electrode regions. Then, the interaction layer is selectively removed from portions of the electrode region where conductive bonds (e.g., ultrasonic ribbon bonds) are to be formed. FIGS. 2A-2C illustrate a portion of a solar substrate similar to that shown in FIGS. 1A-1B, with like elements having similar reference numerals. In FIG. 2A, conductive layer 204 is on glass layer 202 (or another base material for layer 202 such as steel, metal foils, polyimide, other lighter or flexible base materials, among others). Absorbing layer 206 (including upper TCO layer 206a) is above conductive layer 204. Interaction layer 206b has formed between absorbing layer 206 and conductive layer 204. It is desired to form conductive bonds (e.g., using ultrasonic ribbon bonding) on electrode portion 204a (and electrode portion 204b, not shown). Thus, in FIG. 2B, absorbing layer 206 (e.g., a CIGS absorbing layer) has been removed from the desired area (e.g., using scraping, brushing, laser ablation, etc); however, interaction layer 206b remains. In FIG. 2C, interaction layer 206b has been selectively removed to allow for conductive bonding to electrode region 204a. Care must be taken in the removal of interaction layer 206b because of the possibility of damaging electrode region 204a or other areas of the solar substrate. According to the present invention, a portion of interaction layer 206b is removed from electrode region 204a of conductive layer 204 using brushing. This portion of interaction layer may desirably coincide with a bonding location of electrode region 204a (e.g., a portion of electrode region 204a where a conductive ribbon is bonded).

Figure 3:
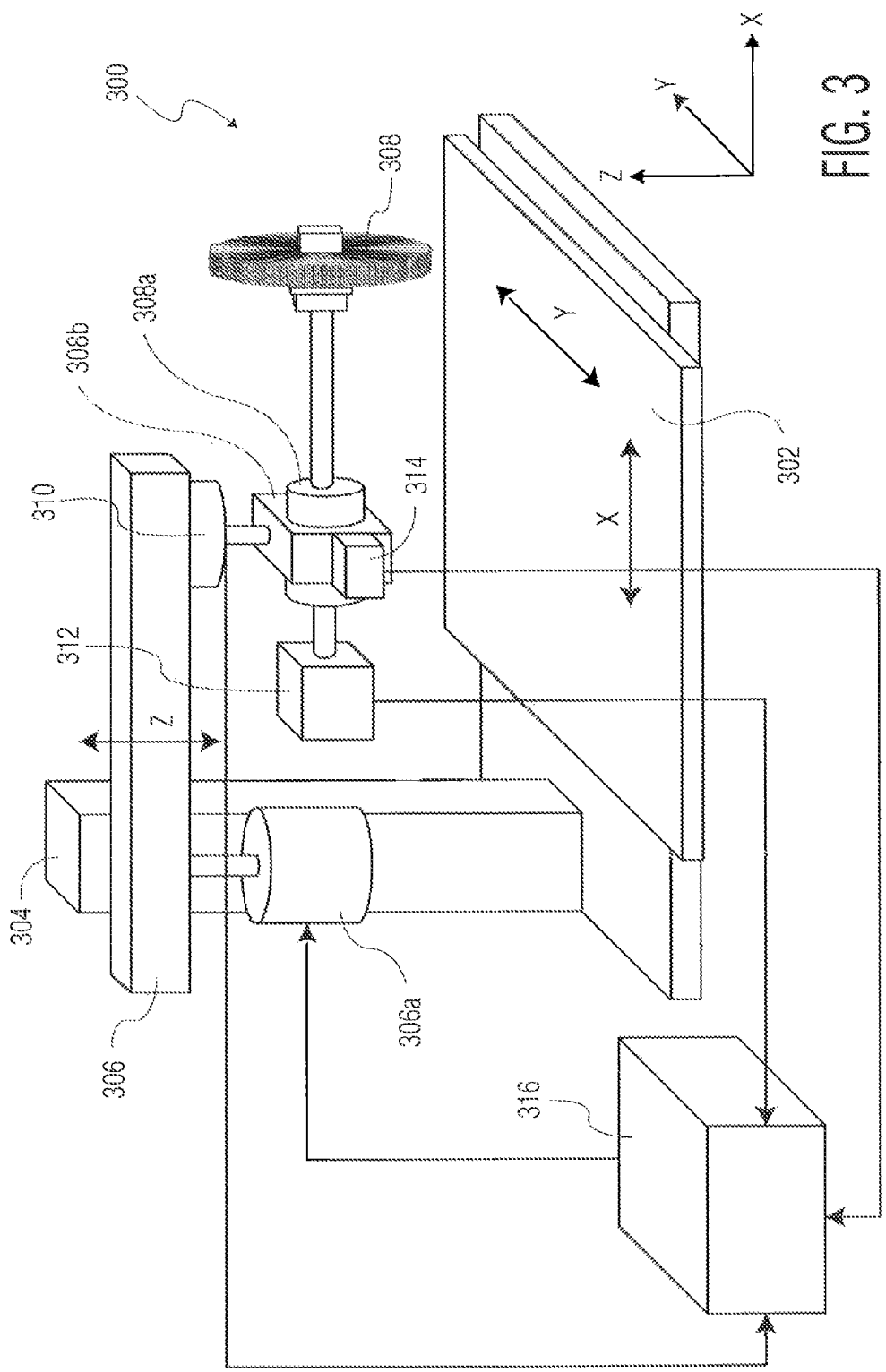
FIG. 3 is a block diagram perspective view of a system for selectively removing an interaction layer from an electrode region of a solar substrate in accordance with an exemplary embodiment of the present invention.

FIG. 3 is a block diagram view of an exemplary system for processing a solar substrate. As will be appreciated by those skilled in the art, the illustrated system is conceptual in nature. The system includes support structure 302 for supporting a solar substrate (not shown) and brushing system 300 for selectively removing an interaction layer from an electrode region of the solar substrate. Support structure 302 is a moving stage configured to move along at least one of the x-axis and y-axis directions (of course, brushing system 300 could also move along these axes if desired). Brushing system 300 includes rotary brush 308 (including a shaft that extends in a direction substantially parallel to a surface of an electrode region positioned on support structure 302) driven by brushing motor 308a (e.g., an AC or DC motor, a voice coil motor, etc.), where motor frame 308b is supported by moving beam 306 (and moving beam 306 is supported by frame 304). Exemplary speeds for brushing motor 308 are between 2,000-30,000 rpm, and in certain applications a variable speed brushing motor is provided such that: (1) the motor speed may be changed during a single brushing process (e.g., where the brushing process commences at a first faster speed, and continues at a second slower speed), and/or (2) the brushing speed may be changed from one device being brushed to another device being brushed. Moving beam 306 is driven along the z-axis by positioning motor 306a (e.g., an AC or DC motor, a voice coil motor, etc.). Controller 316 is used to manage the brushing process and receives information related to various characteristics of the brushing operation. For example, controller 316 may monitor (a) a speed of brushing motor 308a from tachometer 312; (b) a force applied between brush 308 and a surface of the electrode region (not shown) from force sensor 310; (c) a brushing time; (d) a brushing sound (such as the brushing motor sound or the sound of the bristles during brushing); (e) a current of brushing motor 308a from current probe 314; and (f) a torque of the brushing motor. Different or additional characteristics of the brushing operation (e.g., change in color of the area being cleaned, a temperature of the portion of the electrode region being brushed (either a single temperature or a temperature change), a temperature of a portion of the brush such as the bristles (either a single temperature or a temperature change), electrical resistance/impedance of the area being cleaned, etc.) may be monitored by controller 316. Controller 316 may stop the brushing (e.g., by raising brush 308 above the electrode region of the solar substrate) after a specific pre-set time, and/or, preferably, upon one or more of the monitored characteristics reaching at least one of (a) a predetermined value, (b) a predetermined amount of change, and (c) a predetermined rate of change. In this context, the term "upon" is intended to mean stopping of the brushing immediately at the time when the characteristic reaches the predetermined value, the predetermined amount of change, and/or the predetermined rate of change (with no intentional time delay). However, the term "upon" is also intended to refer to stopping of the brushing with some time delay (e.g., a predetermined time delay). This process will be described in further detail in connection with FIG. 7.

Figure 4A:
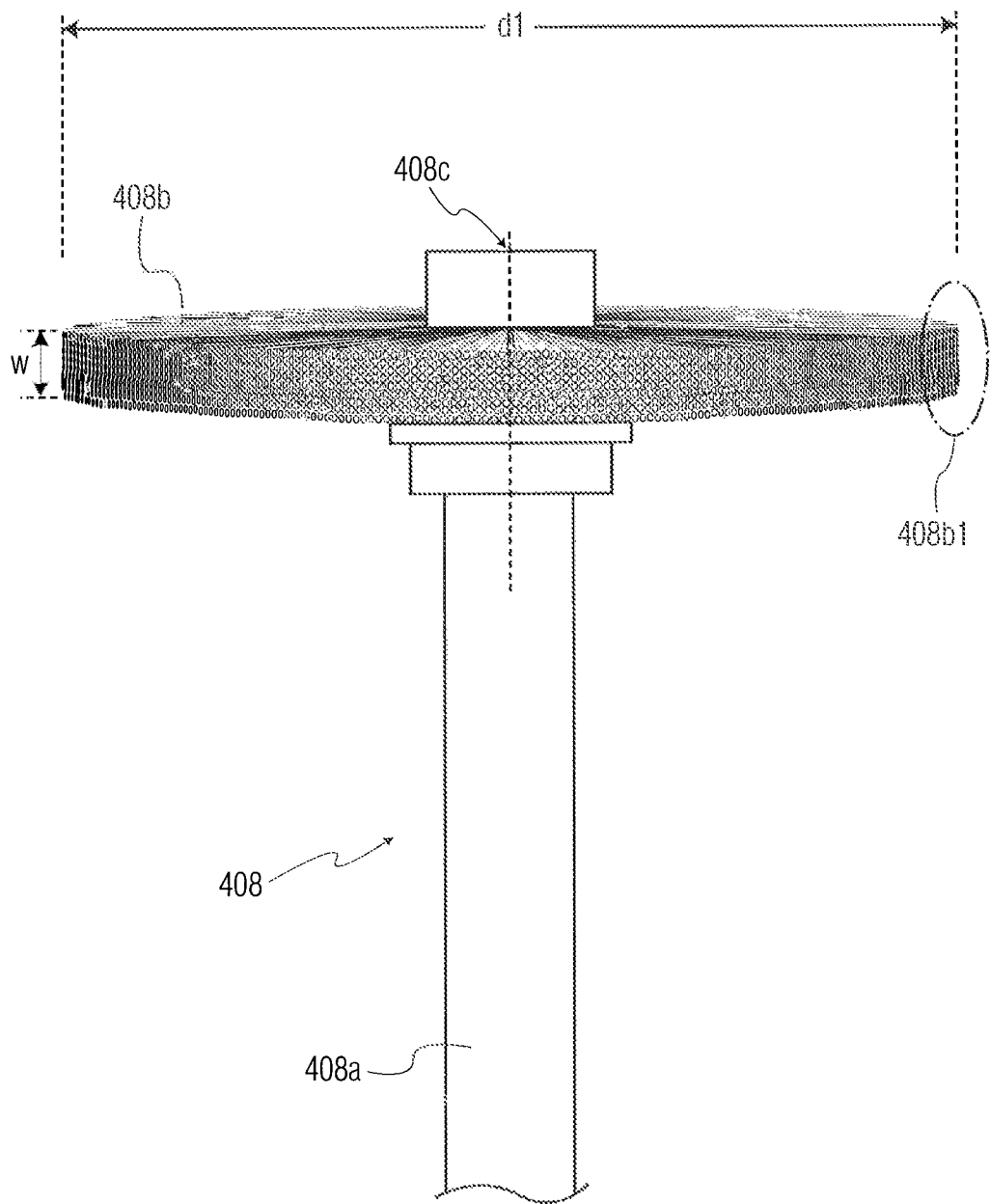
FIGS. 4A-4C are side perspective views of brushes for selectively removing an interaction layer from an electrode region of a solar substrate in accordance with various exemplary embodiments of the present invention.
Figure 4B:
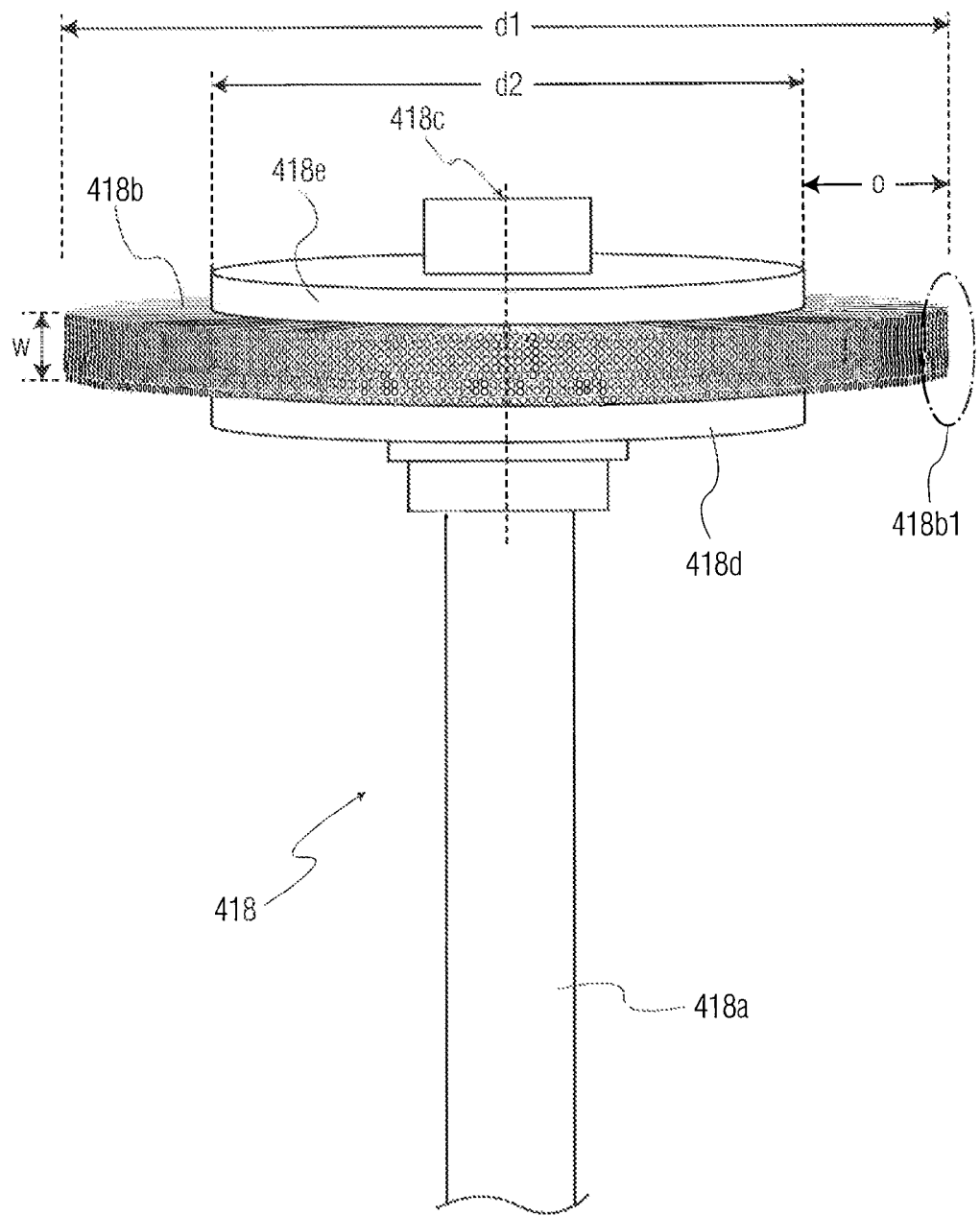
Figure 4C:
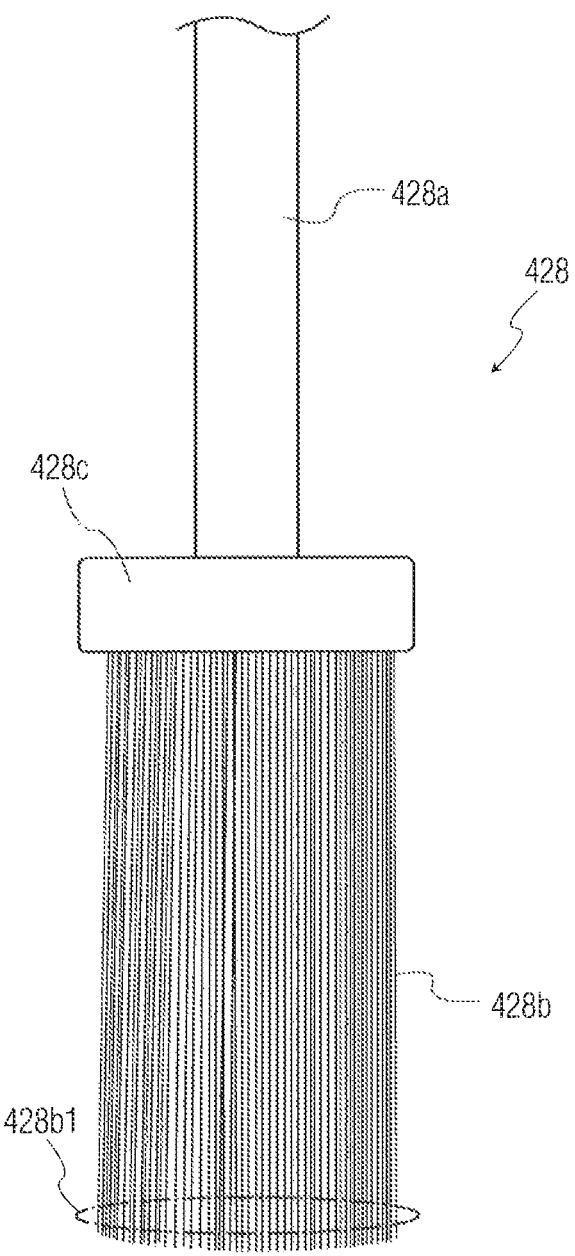

FIGS. 4A-4C illustrate exemplary brushes that may be used in connection with the present invention. FIG. 4A illustrates brush 408 (similar to brush 308 shown in FIG. 3). Brush 408 includes shaft 408a, bristles 408b, and central portion 408c. Brush 408 is configured to be used in conjunction with a motor (such as motor 308a of FIG. 3A) as a rotary brush, where the motor spins shaft 408a (e.g., where shaft 408a may be configured to extend in a direction substantially parallel to a surface of an area to be brushed during a brushing operation). Bristles 408b radiate from central portion 408c, each bristle extending in a direction from central portion 408c (at the shaft 408a) toward an outer edge of the bristle (outer portion 408b1). Brush 408 is configured to be used in a manner similar to brush 308 in FIG. 3, and as such, brush 408 is lowered such that outer portion 408b1 of bristles 408b contacts the area to be brushed, and after the cleaning/removal of the area (i.e., when the controller determines that the operation is complete) brush 408 is raised such that it no longer contacts the area.

During a brushing operation using brush 408, the outer portions 408b1 of ones of the bristles contact the area to be brushed during rotation of the shaft, where the ones of the bristles brushing the area continuously change based on the rotation of shaft 408a. During this rotation, bristles 408b (including outer portions 408b1) tend to spread or fan out, thereby brushing a larger area. While such a result may be desirable in certain applications, the area brushed tends to vary considerably, especially as the brush is used over time. This may cause a need for rapid replacement of the brush, thereby increasing the cost, and reducing the up-time, of the brushing operation.

Brush 418 of FIG. 4B includes shaft 418a, bristles 418b (including outer portion 418b1), and central portion 418c. Brush 418 is similar to brush 408 of FIG. 4A (in appearance and in operation) except that brush 418 includes a first confining structure 418d on a first side of bristles 418b and a second confining structure 418e on a second side of bristles 418b, such that bristles 418b are confined between first confining structure 418d and second confining structure 418e, wherein outer portion 418b1 of bristles 418b extends past first confining structure 418d and second confining structure 418e. The illustrated exemplary confining structures are washers 418d and 418e, but other confining structures are contemplated. More specifically, bristles 418b are sandwiched between washers 418d and 418e. By confining bristles 418b between washers 418d and 418e, the area to be brushed is more controlled. When looking back to FIG. 3 to appreciate an exemplary orientation of brush 418 in a system, washers 418d and 418e confine the bristles in the x-direction, thereby impacting the resultant brushed area in both the x-direction and y-direction.

For example, the dimensions of brush 408 and 418 (including, where applicable, brush diameter "d1", washer diameter "d2", brush width "w", bristle overhang length "o", the bristle length, amongst others) may be selected based on the desired size of the area to be cleaned. For example, the bonding location of an electrode region will have a desired size, and the brush dimensions may be selected to clean an area that approximates the dimensions of the bonding location.

The diameter "d1" of brush 408/418 may vary considerably. An example range for diameter "d1" is between 0.5-2.0 inches, with example diameters "d1" including 0.75 inches, 1 inch, and 1.5 inches, amongst others based on the given application. Example diameters "d2" should be somewhat less than the diameters "d1" of a respective brush. For example, the diameter "d2" of the washers may be between 60-99.9% of diameter "d1" of the brush. Other example ranges are between 70-99.9% and 80-99.9%. The bristle length may be in the range 0.1-1.0 inches, with other example ranges being 0.2-0.7 inches, and 0.25-0.5 inches. The bristle diameter may also vary widely, with example ranges being 1-10 mils, and 3-8 mils, with a specific example bristle diameter being 5 mils. It will be appreciated that the free length of the bristles (i.e., overhang "o") has a direct correlation to the width of the cleaned area. Example overhang values "o" may be between 0.1-8.0 mm; however, it is understood that the overhang "o" should be considered in view of various parameters including the speed of the brush motor, the duration of the cleaning phase, and the interaction layer (e.g., its thickness, its Se content, etc.).

Width "w" of the brush may be selected based on the application. For example, if the bristle length, material, and overhang "o" (and/or other characteristics) are selected where the brushed area in the width direction will be larger than width "w" of the brush (because the bristles squash and/or spread upon during force and/or contact with the brushed area), then this should be considered during brush selection. Exemplary ranges for width "w" are between 0.25-5 mm and 1-3 mm.

The selection of the length of the bristles, in combination with their diameter, allows adjusting of the bristle stiffness. Example stiffness values for a single bristle are between 1-100 N/m, 1-10 N/m, and 2-5 N/m. Example hardness values for the bristles is between HRC 34-39. By having the bristles sufficiently flexible, potential for scratching of the conductive Mo layer can be reduced. As opposed to bristles having a substantially circular diameter, bristles having a ribbon configuration (or others such as oblong) are contemplated. That is, the aspect ratio of a bristle, i.e., the bristle's width versus its thickness could be different than one. The bristles are desirably flexible enough to bend and be pulled over the surface.

To achieve the desired flexibility of the bristles a number of factors may be considered. For example, longer and thinner bristles tend to be more flexible than shorter, thicker bristles. But there are limitations to the length such as the tight spacing on the electrode region. Of course, a less stiff material (based on Young's modulus) could be selected for the bristles. It is generally desired that the bristles have a substantially equal length for uniformity of the process. It is also desirable that the bristles not be too sharp. An alternative bristle design would be looped bristles that do not have an end tip, but are folded such that the bent portion slides over the substrate.

As opposed to brushes including bristles radiating from a center portion as in FIGS. 4A-4B, brush 428 of FIG. 4C includes bristles 428b extending down from bristle holder portion 428c (i.e., a cup portion). Brush 428 is configured to be used in conjunction with a motor as a rotary brush, where the motor spins shaft 428a (e.g., where shaft 428a may be configured to extend in a direction substantially perpendicular to a surface of the area to be brushed during a brushing operation). Bristles 428b spin with shaft 428a. Brush 428 is lowered such that bottom portion 428b1 of bristles 428b contacts the area to be brushed, and after the cleaning/removal of the area (i.e., when the controller determines that the operation is complete) brush 428 is raised such that it no longer contacts the area.

The material of the bristles, like the other characteristics of the brush, may vary widely based on the desired application. One consideration regarding the bristle material should be the material of the electrode region. For example, when the material of the electrode region is Mo (as described above) then it may be desirable to select a bristle material that has a hardness that is lower (perhaps only slightly lower) than Mo in order to reduce scratching or potential damage to the electrode region during selective removal of the interaction layer. Of course, the hardness of the conductive layer (of which the electrode region is included) may vary even if it is Mo because annealed Mo has a hardness of HRC 19, but other Mo coatings have a hardness up to HRC 45, and even higher. Exemplary bristle materials tested include: (1) brass (HRC 20-27); (2) stainless steel (HRC 44-50); and (3) carbon steel (HRC 34-39).

Testing was performed with an exemplary Mo coating on the electrode regions, and during this testing brass brushes exhibited limitations in that some of the relatively soft brass material was deposited to the Mo coating. Carbon steel brushes consistently tested well in that the bristles were sufficiently flexible for the brushing but did not significantly scratch the Mo surface. Stainless steel brushes (which may reduce concerns related to corrosion of carbon steel bristles) tend to cause more scratches than carbon steel, as they tend to have a higher hardness. Nonetheless, a stainless steel brush could work well if the stainless steel has a sufficiently low hardness in comparison to the electrode region material (e.g., Mo), for example, due to an appropriate thermal annealing, and based on other process conditions (e.g., motor speed, force, etc.). Of course, any of a number of materials could be used for the bristles depending upon the application, and only examples are described herein.

The system illustrated in FIG. 3 includes a single motorized brush 308. Depending upon factors such as the thickness of the interaction layer, the brush motor speed used, and the force applied between the brush and the surface of the electrode region, the time for the cleaning process of the interaction layer at one bond location may be significant in comparison to the actual bonding time. In certain applications it may be desirable to have multiple brushes operable at the same time.

FIG. 5A illustrates, in block diagram form, a portion of solar substrate 500 (similar in configuration to solar substrate 100 in FIG. 1A) including absorbing layer 506 and electrode region 504a. Electrode region 504a includes ten bonding locations 504a1, each bonding location being configured to receive a bonded portion of a conductor (e.g., a conductive ribbon). FIG. 5A also illustrates, in block diagram form, brushing system 550. Brushing system 550 includes ten brushes 558. Each of brushes 558 includes shaft portion 558a and bristles 558b, and is similar to brush 418 shown in FIG. 4B. Because brushing system 500 includes ten brushes, each of the ten bonding locations 504a1 may be cleaned simultaneously, thereby saving a significant amount of time in comparison to a single brush system. As shown in FIG. 5A, the center to center spacing of the brushes (i.e., "SPACING 1") is approximately the same as the center to center spacing of the bonding locations (i.e., "SPACING 2"). Of course, any of a number of brushes, in any number of configurations, may be provided, as is desired in a given application. In applications where the spacing of the bonding locations is smaller than the brush diameter allows, the brushes may be arranged to process every other bonding location (e.g., "SPACING 1"=2 times "SPACING 2"), and then brushing system 550 may be indexed by the distance between two bonding locations (e.g., "SPACING 2") to process the remaining bonding locations. Further, if desired in a given application, some (or all) of the brushes of a brushing system may be individually operable. That is, the brushes may be individually controllable such that their respective motors may be turned on, turned off, varied (e.g., speed, force, etc) and/or the brushes may be individually moved to contact (e.g., lowered) or moved away from (e.g., raised above) the portion of the electrode region being cleaned. Alternatively, all of the brushes may be lifted at the same time when a first brush reaches a transition point such as that shown in FIG. 7.

Figure 5B:
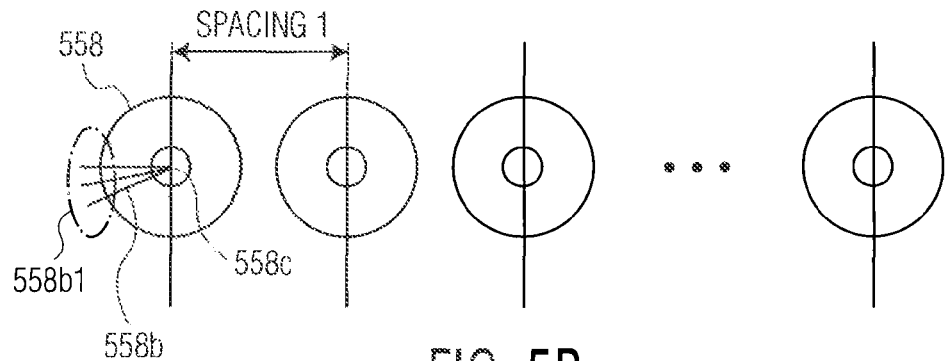
FIG. 5B is a block diagram side view of a plurality of brushes of the system of FIG. 5A.
Figure 5C:
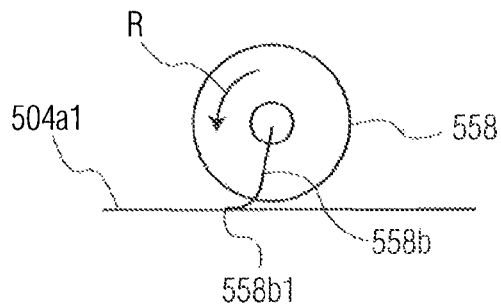
FIG. 5C is a block diagram side view of a portion of a brush of FIG. 5A in contact with a bonding location.

FIG. 5B is a conceptual side view of a plurality of brushes 558, each including bristles 558b (only 3 bristles 558b of one brush 558 is illustrated). Bristles 558b radiate from center portion 558c toward outer portion 558b1 (i.e., each of bristles 558b extends in a direction from a shaft of the brush, coincident center portion 558c, toward outer edge 558b1 of the given bristle 558*b*). FIG. 5C is a conceptual side view of a single brush 558 with only a single bristle 558*b* illustrated. During rotation "R" of brush 558 counterclockwise as shown in FIG. 5C, end portion 558*b*1 of bristle 558*b* tends to scrub bonding location 504*a*1 as shown.

Figure 6:
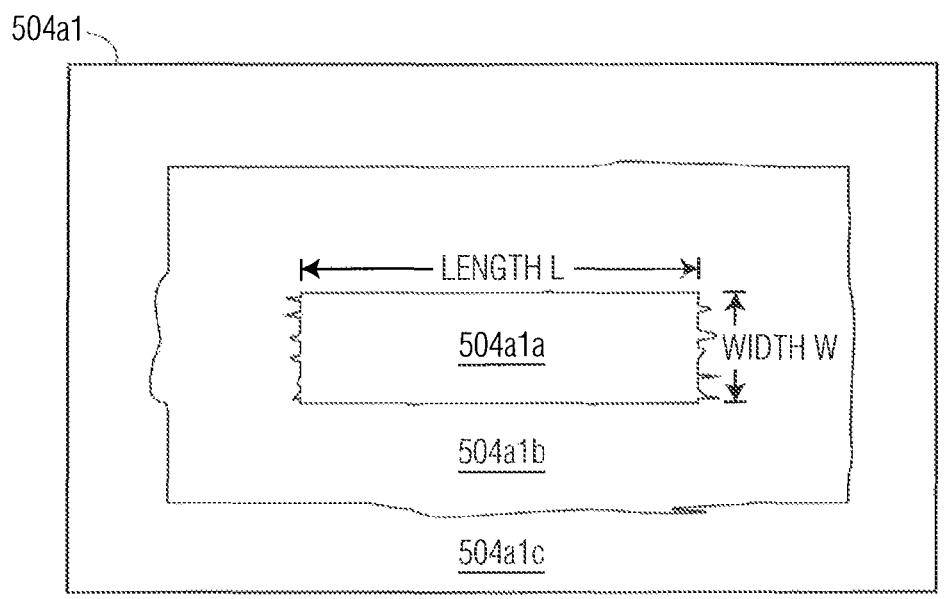
FIG. 6 is a block diagram top view of a bonding location processed in accordance with an exemplary embodiment of the present invention.

Referring back to FIG. 5A, an exemplary one of bonding locations 504*a*1 (the lower-right most bonding location 504*a*1) is detailed in FIG. 6. More specifically, FIG. 6 illustrates bonding location 504*a*1 after brushing by one of brushes 558 of brushing system 550 of FIG. 5A. Bonding location 504*a*1 in FIG. 6 includes three regions: (1) inner cleaned area 504*a*1*a*; (2) middle area 504*a*1*b*; and (3) outer area 504*a*1*c*. Inner cleaned area 504*a*1*a* generally corresponds to the area where the center of brush 558 contacts the bonding location (to remove the interaction layer), and is considered the "cleanest" area of the three regions and is prepared for ultrasonic bonding (and has a very low Se content such as less than 1% Se content as measured using an EDAX spectrum measurement).

Area 504*a*1*a* is cleaned by densely arranged bristles 558 that are only bent slightly, and are under a higher local pressure than at area 504*a*1*b*. The removal of the interaction layer (e.g., the MoSe$_2$ layer) is most efficient here, and brush 558 contacts the underlying electrode region (e.g., the Mo layer). Area 504*a*1*a* causes a change in load to the brush motor, which corresponds to a characteristic transition of the force and current signals shown in FIG. 7 (labelled as "TRANSITION"). Brush 558 is configured (e.g., bristle type/size, etc.) such that area 504*a*1*a* is sized to receive a bonded portion of a conductor (e.g., a conductive ribbon). In one example, area 504*a*1*a* has a width "W" from between 0.50 mm-2.50 mm, and a length "L" between 2.0 mm-4.0 mm.

Middle area 504*a*1*b* is created, at least partially, by the deflection of bristles 558*b* under the force with which brush 558 is pressed against bonding location 504*a*1, and because of the motion of brush 558 due to a possible non-perpendicularity of rotating shaft 558*a*. More specifically, area 504*a*1*b* is cleaned by less densely arranged (as compared to the dense bristles that scrub area 504*a*1*a*) bent bristles 558*b* which wipe over that area as shown in FIG. 5C with lower local pressure than in area 504*a*1*a*. Middle area 504*a*1*b* is not as clean as area 504*a*1*a*, but is cleaner than outer area 504*a*1*c* (and may have a Se content between that of area 504*a*1*a* and 504*a*1*c*), and may be considered acceptable for ultrasonic bonding. The size of area 504*a*1*b* may be affected by, for example, the dimensions of brush 558, and by the non-perpendicularity of brush 558. Outer area 504*a*1*c* remains substantially as it was prior to brushing by brush 558. That is, the content of the interaction layer (and the Se content of the layer if it is an MoSe$_2$ layer) in area 504*a*1*c* is unchanged and is determined by the first cleaning step (i.e., the removal of the absorbing layer).

Figure 7:
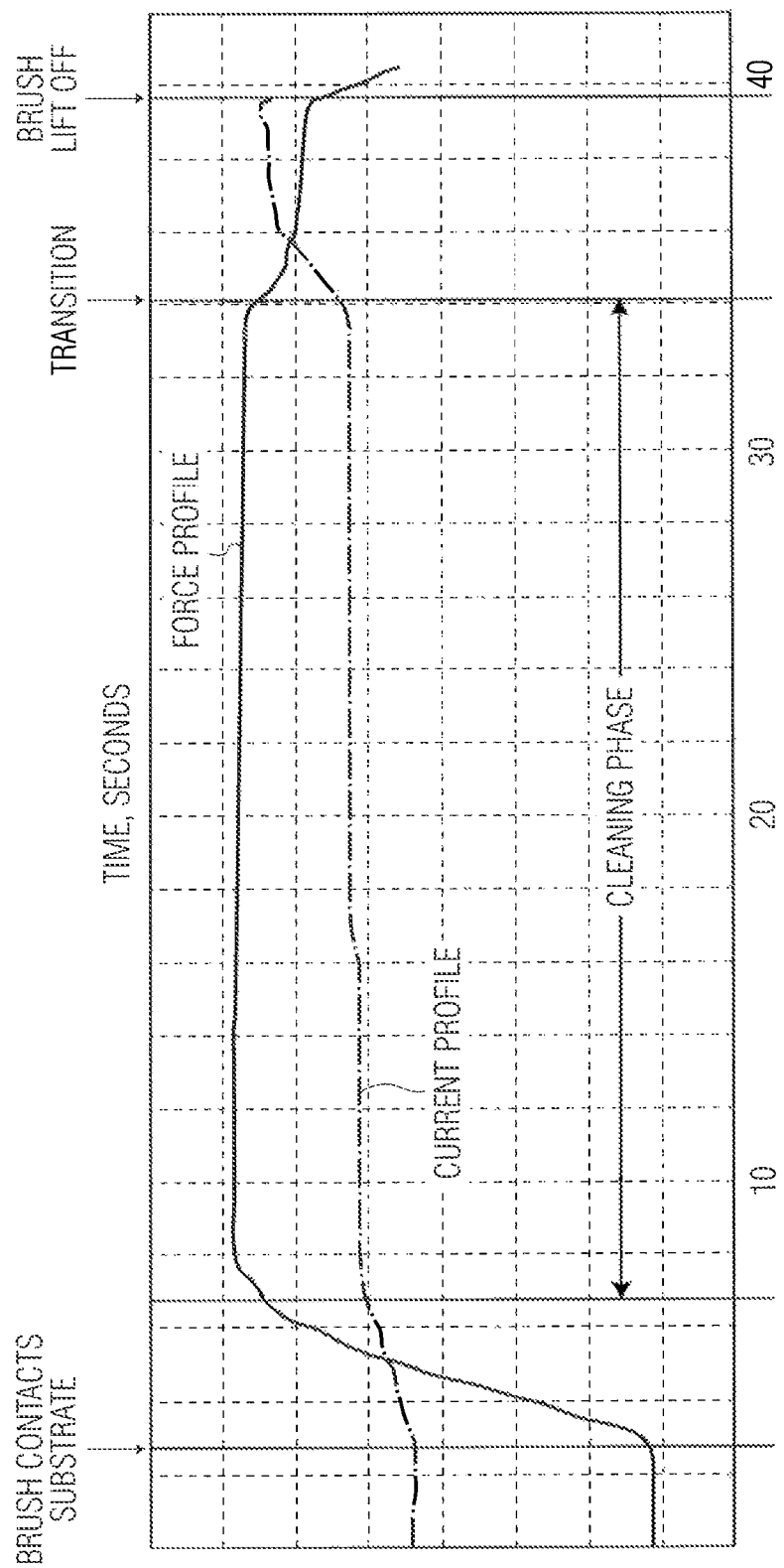
FIG. 7 is a scope trace timing diagram useful in illustrating a method of selectively removing an interaction layer from an electrode region of a solar substrate in accordance with an exemplary embodiment of the present invention.

FIG. 7 is a timing diagram illustrating a motor current profile (a broken line) and a force profile (a solid line) as measured during a cleaning cycle for selectively removing an interaction layer on an electrode region in accordance with an exemplary embodiment of the present invention. The force is that measured between the brush and the portion of the electrode region contacted by the brush (e.g., as measured by a force sensor such as sensor 310 shown in FIG. 3). In this example, the initial force applied was 300 g, and the initial motor speed was 5,000 rpm. As is detailed below, the current and force profile consist of distinct phases.

As shown in FIG. 7, the current increases when the rotating brush contacts and is pressed against the substrate (labelled as "BRUSH CONTACTS SUBSTRATE"). Friction between the substrate surface and the brush creates a load on the motor (increasing the current at a certain rate), and then the current settles somewhat at a higher level (at about 7 seconds), but still continuously increases more slowly until about 34 seconds. The period between the current settling (at about 7 seconds) and the current reaching a maximum (at about 34 seconds) may be termed the cleaning phase (in this case, lasting about 27 seconds, and labelled as "CLEANING PHASE"). At the end of this phase, the current suddenly shows a steep increase to a higher level (at about 36 seconds), from which it again slowly increases further until the brush is lifted off of the substrate (labelled as "BRUSH LIFT OFF"), at which time the current decreases quickly to the initial level before it was lowered in contact with the substrate. As shown in FIG. 7, the force decreases during the cleaning phase, and then falls sharply at the transition (at about 34 seconds) where the current increases.

Of course, the profiles in FIG. 7 are exemplary in nature and depend on the substrate properties, the brushing system used, the speed of the brushing motor, the initial force applied, amongst others. Thus, while the cleaning phase lasts 27 seconds in FIG. 7 (a relatively long time), cleaning phases of 5 seconds, 1 second, or even less than 1 second, have been developed. Nonetheless, in many exemplary embodiments of the invention, the profile of the force and current follow the general shapes shown in FIG. 7, and importantly, the transition point is detectable. As opposed to the system used in FIG. 7, it will be appreciated that the system may be operated with closed loop force control, which would reduce variations in the applied force (which is desirably maintained within a range of plus or minus 10%), and would result in a more predictable cleaning phase.

In the example shown in FIG. 7, the interaction layer is a MoSe$_2$ layer. As the MoSe$_2$ layer may be considered a solid lubricant, the friction between the brush and the substrate is low. Thus, the steady increase in motor current is interpreted as a steady increase in load, likely due to an increasing area where the brush and its bristles make contact with the underlying conductive Mo layer.

The current increase during the cleaning phase is accompanied by a continuous decrease in force on the substrate. This force consists of (1) a static component from the flexible brush being pressed against the substrate; and (2) a second force component, which is caused by the rotating brush. This static force should be substantially the same with or without the motor rotating and is largely a function of (and can be controlled through) the z-position of the brush's shaft relative to the substrate surface. The second force component, which decreases during the cleaning phase, relates to a decrease in motor torque because a load seen by the motor increases.

Once the MoSe$_2$ interaction layer is removed, the cleaning process is desirably stopped in order to minimize brush wear and to limit potential for damage to the conductive Mo layer. There is a sharp change in current and force at the end of the cleaning phase (i.e., the transition point). The change in current and/or force (or other characteristics) can be detected and used as a trigger to lift the brush from the substrate.

Exemplary experiments illustrating a profile similar to that shown in FIG. 7 include the following: (1) for a substrate with a thicker interaction MoSe$_2$ layer, (a) an initial force of 225 grams, and motor speed of 10,000 rpm, illustrated a cleaning phase of 25.5 seconds, and (b) an initial force of 300 grams, and motor speed of 15,000 rpm, illustrated a cleaning phase of 12.8 seconds; and (2) for a substrate with a thinner MoSe$_2$ interaction layer, (a) an initial force of 300 grams, and motor speed of 5,000 rpm, illustrated a cleaning phase of 5.8 seconds, and (b) an initial force of 225 grams, and motor speed of 15,000 rpm, illustrated a cleaning phase of 3.8 seconds.

Experimentation has illustrated a clear relationship between (1) cleaning time and Se content or $MoSe_2$ interaction layer thickness, for different substrates; and (2) cleaning time and brush speed and force for a given substrate. Generally, a thicker interaction $MoSe_2$ layer requires a longer cleaning time. Generally, a decrease in brush speed results in an increase in duration of the cleaning phase. Similarly, a decrease in force results in an increase of the duration of the cleaning phase.

Because of the predictability of the transition point (labelled as "TRANSITION" in FIG. 7), it may be desirable to monitor a characteristic of a brushing operation during the brushing (such as the force and/or current) and to stop the brushing upon the characteristic reaching at least one of (a) a predetermined value, (b) a predetermined amount of change, and (c) a predetermined rate of change. The stopping of the brushing may be, for example, by (1) removing/lifting the brush up off the substrate and/or (b) stopping the motor. If the characteristic is the current, the monitoring system may look for the sudden increase in current at the transition point. If the characteristic is the force, the monitoring system may look for the sudden decrease in force at the transition point.

Of course, other characteristics may be monitored and used in the closed loop control of the brushing operation. Exemplary characteristics include a speed of a brushing motor, a sound of the brushing motor, an elapsed brushing time, a brushing sound (such as the brushing motor sound or the sound of the bristles during brushing), a torque of a brushing motor, a color of the brushed surface, etc. Any of the characteristics may be modeled (as done for current in force in FIG. 7) in a given application such that the predetermined characteristic value (or predetermined amount of change of the characteristic, or a predetermined rate of change of the characteristic, etc.) may be predictable for use in stopping the brushing operation.

In monitoring the characteristic of a brushing operation as described above, a time delay may elapse before stopping the brushing, but after the monitored characteristic has reached the (a) a predetermined value, (b) a predetermined amount of change, and (c) a predetermined rate of change. For example, depending upon the application and the characteristic being monitored, it could be determined that a brief time delay could provide beneficial results.

In certain applications it may be desirable to alter certain characteristics partially through the brushing operation. For example, the motor current, the motor speed, and/or the force may operate at a high level for a predetermined time period, and then be reduced to a lower level. By operating the selected characteristic(s) at a lower level toward the end of the brushing operation, the transition point where the interaction layer has been removed may be more accurately monitored. Further, potential damage to the underlying electrode material (e.g., Mo) can be minimized. Further still, brush wear can be reduced.

It is desirable that the brushing operation (to remove the interaction layer) be stopped quickly enough that the conductive material of the electrode region (under the interaction layer) not be significantly damaged. If the brushing operation extends too long, parts of the conductive layer may actually peel from the glass layer resulting in poor ultrasonic bonding. In some applications it will be desirable to stop the brushing as closely to the transition point as possible (e.g., less than 1 second after the transition point is reached, less than 0.5 seconds after the transition point is reached, etc.). In other applications, the process is less sensitive, and an acceptable time window exists around the transition point (i.e., the brushing process may be interrupted within a few seconds before the transition point is reached, or the brushing process may be interrupted within a few seconds after the transition point is reached).

Figure 8:
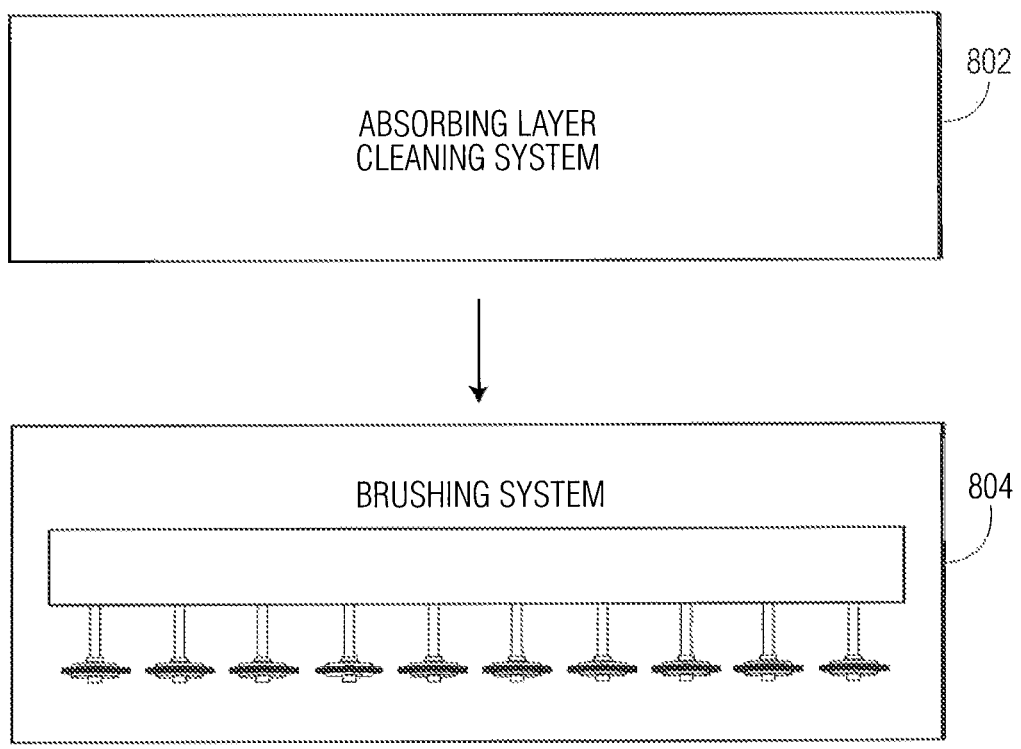
FIG. 8 is a block diagram view of a system for processing a solar substrate in accordance with an exemplary embodiment of the present invention.

FIG. 8 illustrates an exemplary system for processing a solar substrate. The system includes removal system 802 for removing an absorbing layer from an electrode region of the solar substrate. The absorbing layer is configured to convert light energy into electrical energy. System 802 may use any of a number of techniques for the bulk removal of the absorbing layer such as, for example, brushing, laser ablation, microblasting, and mechanical scraping.

If bulk brushing is used in system 802 there is a risk that the absorbing layer is not homogeneously removed (due to the bristle structure of a brush). Further, absorber material tends to adhere to (and build up on) the bristles, enabling re-deposition of the removed material. Further still, there is a risk that the force/pressure used in such bulk removal will cause the bristles to scratch the underlying conductive Mo layer.

If laser ablation (or micro-blasting) is used in system 802 there is a risk of damage to the underlying conductive Mo layer (causing bonding problems), and even to the glass substrate, potentially resulting in larger cracks in the substrate during ultrasonic bonding and/or during subsequent operation of the device. Micro damage to the conductive Mo layer can weaken that layer and result in delamination during or after ultrasonic bonding of conductive ribbon bonded to that conductive Mo layer. Such systems are also relatively expensive due to the continuous use of laser energy or microparticles.

Experimentation by the inventors has indicated that the use of mechanical scraping in system 802 may be more promising than the alternative techniques described herein. A scraper can be manufactured to an exact geometry at a moderate cost. Thus, the scraped area of the absorbing layer can be designed to coincide with the area configured to receive the conductor (e.g., conductive ribbon, busbar tape, etc.). The material of the scraper can be selected to be sufficiently hard to remove the absorbing layer, wear resistant to avoid frequent replacement, and to have a low cost. The selected material may change significantly depending on the absorbing layer. Soft material choices include PVC type materials including Polyvinyl Chloride Acetate (PVCA). Materials having a relatively high hardness (but not as high as the electrode material such as Mo) include, for example, Copper-Tungsten (Cu—W). Exemplary Cu—W ranges include 60-70% tungsten and 30-40% copper. Another alternative material for the scraper is tungsten-carbide.

While these exemplary methods (i.e., bulk brushing, laser ablation, micro-blasting, and scraping) can work well for removal of the less dense absorbing layer (e.g., CIGS), they are much less useful in removal of the more compact interaction layer (e.g., a $MoSe_2$ layer). Selective removal of the interaction layer desirably includes a more controlled method, particularly one with feedback control to ensure accurate material removal. Thus, the system in FIG. 8 also includes brushing system 804 for removing an interaction layer from at least a portion of the electrode region. System 804 may be similar to those described above in connection with the various exemplary embodiments described herein (e.g., systems such as that shown in FIGS. 3, 5A, etc., which illustrate brushes for selectively removing the interaction layer).

Figure 9:
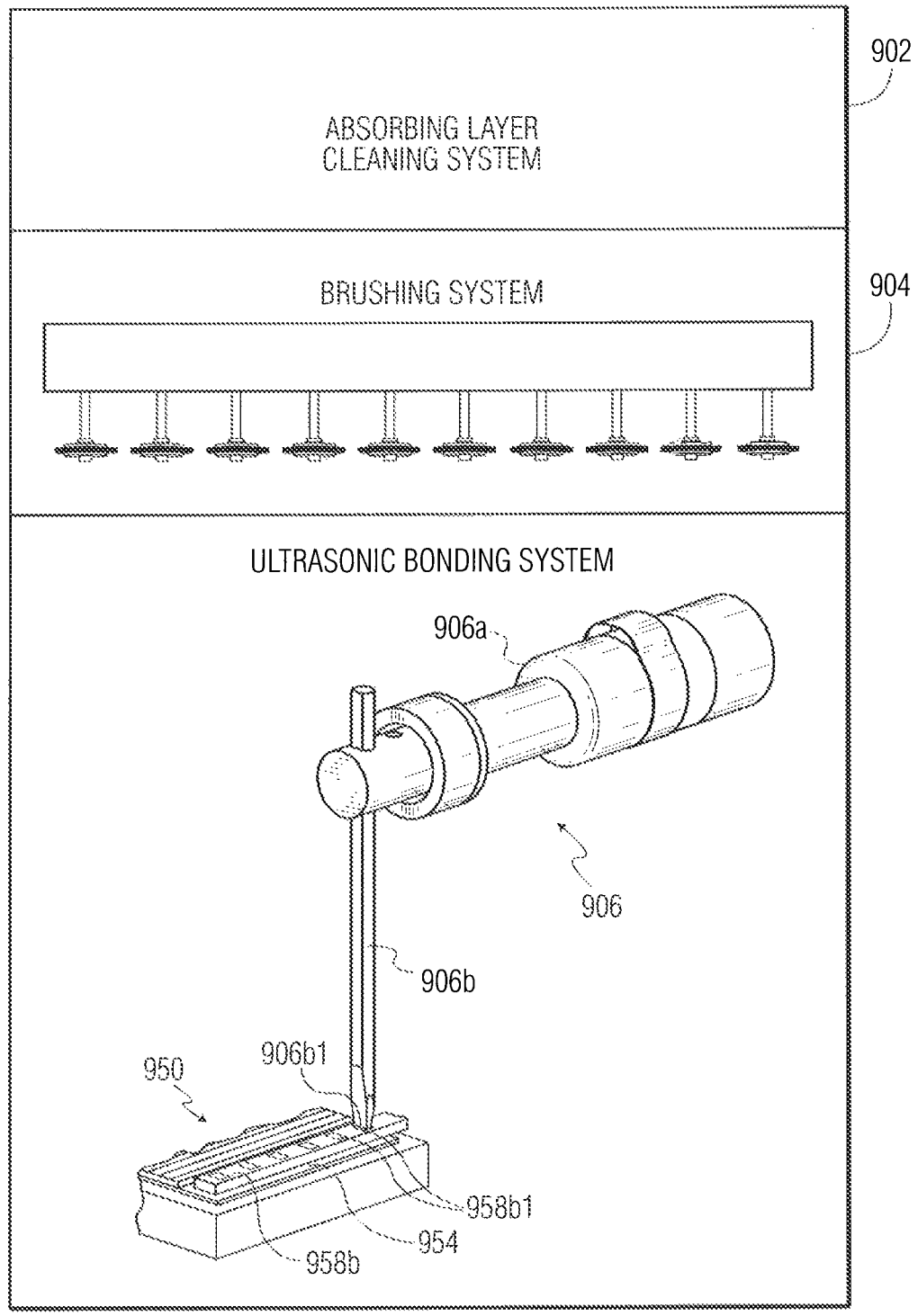
FIG. 9 is a block diagram view of a system for processing a solar substrate in accordance with another exemplary embodiment of the present invention.

FIG. 9 illustrates another system for processing a solar substrate. The system includes cleaning system 902 for removing an absorbing layer from an electrode region of a solar substrate (where system 902 may be considered the same as system 802 of FIG. 8). The system also includes brushing system 904 for removing an interaction layer from at least a portion of the electrode region (where brushing system 904 may be considered the same as brushing system 804 of FIG. 8). The system also includes ultrasonic bonding system 906 configured to bond conductor 958b to electrode region 954 of solar substrate 950. Ultrasonic bonding system 906 includes transducer 906a and bonding tool 906b. Bonding surface 906b1 of bonding tool 906b applies the ultrasonic energy from transducer 906a to conductor 958b to form bonded portions 958b1. Conductor 958b may be any suitable conductor such as a conductive ribbon or a large diameter wire. Examples include flexible Al ribbon, Al—Cu ribbon, and Al—Cu—Ag ribbon, amongst others. Example conductive ribbon dimensions include a width of between 20-220 mils, and a thickness between 1-8 mils.

Figure 10:
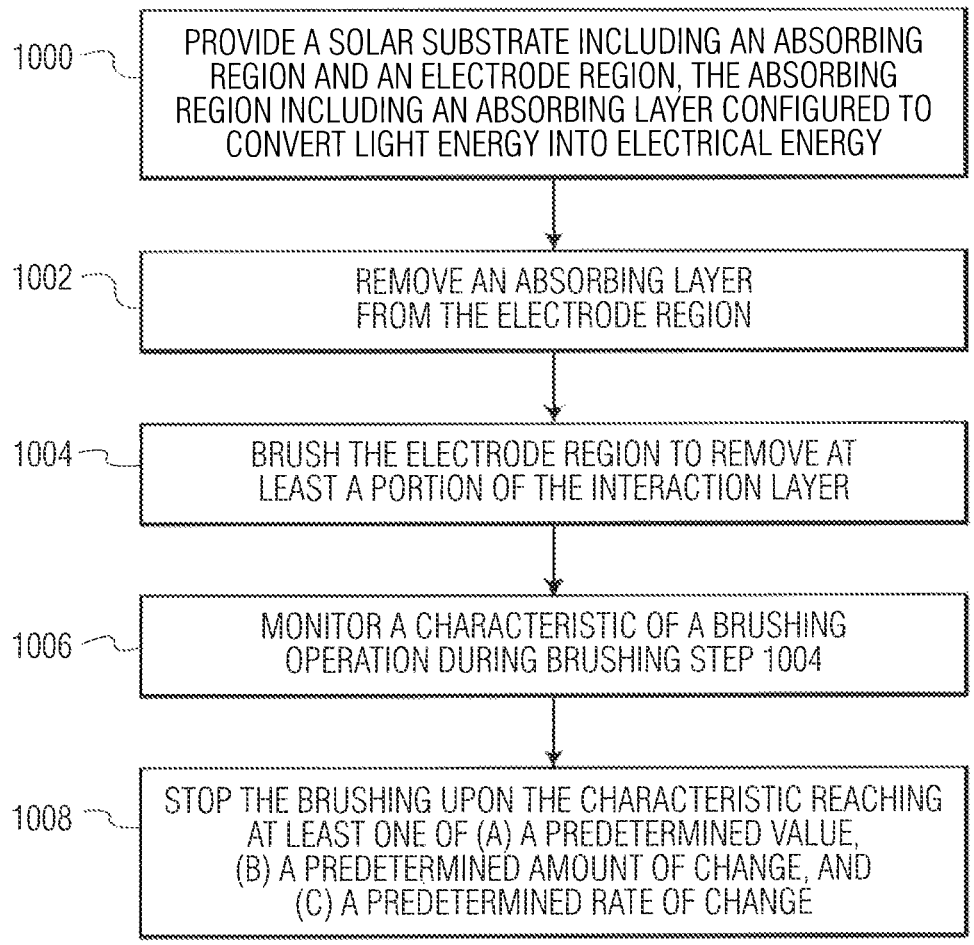
FIG. 10 is a flow diagram illustrating a method of processing a solar substrate in accordance with an exemplary embodiment of the present invention.

FIG. 10 is a flow diagram illustrating a method of processing a solar substrate. At step 1000, a solar substrate is provided including an absorbing region and an electrode region. The absorbing region includes an absorbing layer configured to convert light energy into electrical energy. Exemplary solar substrates include thin film solar substrates (e.g., CIGS type solar substrates) such as those shown in FIGS. 1A-1B and 2A-2C. At step 1002, an absorbing layer is removed from at least a portion of the electrode region. Exemplary removal systems are described above in connection with system 802 of FIG. 8. At step 1004, at least a portion of an interaction layer is brushed from the portion of the electrode region. For example, step 1004 may use the various brushing systems and methods disclosed herein. At step 1006, a characteristic of the brushing operation of step 1004 is monitored. Exemplary characteristics disclosed herein include: a speed of a brushing motor, a force applied between a brush and a surface of the electrode region, a brushing time, a brushing sound (such as the brushing motor sound or the sound of the bristles during brushing), a current of a brushing motor, a torque of a brushing motor, a color of the brushed area, a temperature of the portion of the electrode region being brushed (either a single temperature or a temperature change); and (i) a temperature of the portion of the brush (either a single temperature or a temperature change). At step 1008, the brushing is stopped after the characteristic reaches at least one of (a) a predetermined value, (b) a predetermined amount of change, and (c) a predetermined rate of change. The brushing may be stopped immediately at this time (i.e., with no intentional delay). Alternatively, a predetermined time delay may be provided after the characteristic has reached the predetermined value (and/or the predetermined amount of change, the predetermined rate of change) and before the brushing operation is stopped.

As is understood by those skilled in the art, certain steps included in FIG. 10 (and other methods disclosed herein) may be omitted; certain additional steps may be added; and the order of the steps may alter from the order illustrated or described. For example, the method may include an additional step after step 1002 and before 1004. That is, in certain thin film solar substrates there is no substantial interaction layer on the electrode region following removal of the absorbing layer. Thus, an intermediate step 1003 (not shown in FIG. 10) may be to determine if there is an interaction layer that requires selective removal in step 1006. Such a determination may be made using various techniques such as, for example, (1) resistance/impedance to current flow to the electrode region following step 1002, (2) EDAX spectrum analysis of the surface of the electrode region following step 1002 (e.g., by selecting a threshold Se content such as 2% Se as measured using the EDAX spectrum), and (3) reflectivity analysis of the surface of the electrode region following step 1002 (e.g., using laser light such as red or green laser light), amongst others.

Certain aspects of the present invention (e.g., selectively removing an interaction layer using brushing after the absorbing layer was previously removed) yield a surface well prepared for ultrasonic bonding (i.e., short bond times, strong bonds with high peel forces, etc.). By monitoring a brushing characteristic(s), a closed loop process for automated removal of brushing upon reaching a desired threshold (e.g., the transition point associated with a characteristic with or without a time delay) is provided. By using a two step removal process (where step 1 involves removal of the absorbing layer, and step 2 involves selective brushing of the interaction layer) the cleaning process becomes much less sensitive to factors such as the type of thin film substrate, or even the effectiveness of the absorbing layer removal step.

Although the present invention has been described primarily with respect to selective removal of the interaction layer using brushing, it is not limited thereto. For example, the desired areas of the interaction layer may be removed using ultrasonic scrubbing, laser ablation or the like; however, while ultrasonic scrubbing also enables a closed loop control process via monitoring the impedance or resonance frequency of the ultrasonic system, a technique like laser ablation may provide challenges in monitoring an ablation characteristic and controlling the ablation via a closed loop process, and may only work well for substrates that have an interaction layer with more or less constant thickness.

Although certain exemplary embodiments of the present invention have been illustrated and described in connection with example brushes (e.g., FIGS. 4A-4C) and brushing systems, the present invention is not limited thereto. Any of a number of brush (or brush system) configurations that provides beneficial results in a given application are contemplated within the scope of the present invention.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of removing at least a portion of an interaction layer on an electrode region of a solar substrate, the method comprising the steps of:
   (1) providing a solar substrate including an absorbing region and an electrode region, the absorbing region including an absorbing layer configured to convert light energy into electrical energy, the electrode region being substantially free of the absorbing layer, the electrode region including an interaction layer;
   (2) brushing the electrode region to remove at least a portion of the interaction layer;
   (3) monitoring a characteristic of a brushing operation during the brushing in step (2); and
   (4) stopping the brushing upon the characteristic reaching at least one of (a) a predetermined value, (b) a predetermined amount of change, and (c) a predetermined rate of change, during step (3).

2. The method of claim 1 wherein step (2) includes brushing the electrode region with a rotary brush.

3. The method of claim 1 wherein step (2) includes brushing selected portions of the electrode region corresponding to bonding locations of the electrode region, the bonding locations being configured to receive bonded portions of a conductive ribbon.

4. The method of claim 1 wherein step (3) includes monitoring a speed of a brushing motor used to provide the brushing motion in step (2).

5. The method of claim 1 wherein step (3) includes monitoring at least one of (a) a speed of a brushing motor used to provide the brushing motion in step (2); (b) a force applied between a brush used in the brushing of step (2) and a surface of the electrode region; (c) a brushing time elapsed during step (2); (d) a brushing sound during step (2); (e) a current of a brushing motor used to provide the brushing motion in step (2); (f) a torque of a brushing motor used to provide the brushing in step (2); (g) a color change of the portion of the electrode region being brushed in step (2); (h) a temperature of the portion of the electrode region being brushed in step (2); and (i) a temperature of a portion of the brush during step (2).

6. The method of claim 1 wherein step (3) includes monitoring at least one of (a) a force applied between a brush used in the brushing of step (2) and a surface of the electrode region; and (b) a current of a brushing motor used to provide the brushing in step (2).

7. The method of claim 1 wherein a time delay is provided before the brushing is stopped but after the characteristic reaches the at least one of the predetermined value, the predetermined amount of change, and the predetermined rate of change.

8. The method of claim 1 wherein step (2) includes brushing several individual portions of the electrode region using a plurality of brushes.

9. The method of claim 8 wherein the plurality of brushes are individually operable.

10. The method of claim 1 further comprising the step of (3a) removing an absorbing layer from the electrode region prior to step (1).

11. The method of claim 10 wherein step (3a) includes at least one of (a) scraping the absorbing layer from the electrode region; (b) removing the absorbing layer from the electrode region using laser ablation; and (c) brushing the absorbing layer from the electrode region.

12. The method of claim 1 wherein the solar substrate is a CIGS type thin film solar substrate.

13. The method of claim 1 wherein the electrode region comprises Mo.

14. The method of claim 1 wherein step (2) includes brushing the electrode region using a motorized brush comprising a plurality of bristles extending in a direction from a shaft of the motorized brush toward an outer edge of the bristles.

15. The method of claim 14 wherein step (2) includes brushing the electrode region using the motorized brush such that during rotation of the shaft respective outer edges of particular bristles brushing the electrode region continuously changing based on the rotation of the shaft.

16. The method of claim 1 wherein step (2) includes brushing the electrode region using a motorized brush comprising a plurality of bristles, the motorized brush including a first confining structure on a first side of the bristles and a second confining structure on a second side of the bristles, such that the bristles are confined between the first confining structure and the second confining structure, wherein an outer portion of the bristles extends past the first confining structure and the second confining structure.

* * * * *